United States Patent
Lunenborg et al.

(10) Patent No.: US 6,561,839 B2
(45) Date of Patent: May 13, 2003

(54) PROCESS FOR FORMING SHALLOW ISOLATING REGIONS IN AN INTEGRATED CIRCUIT AND AN INTEGRATED CIRCUIT THUS FORMED

(75) Inventors: Meindert Martin Lunenborg, Crolles (FR); Walter Jan August De Coster, St. Nazaire les Eymes (FR); Alain Inard, St. Nazaire les Eymes (FR); Franck Arnaud, Le Sappey en Chartreuse (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/933,784

(22) Filed: Aug. 21, 2001

(65) Prior Publication Data
US 2002/0048899 A1 Apr. 25, 2002

(30) Foreign Application Priority Data
Aug. 21, 2000 (FR) .................................. 00 10766

(51) Int. Cl.[7] .............................................. H01L 21/76
(52) U.S. Cl. ........................................................ 439/440
(58) Field of Search ........................ 438/440, 445, 438/439

(56) References Cited

U.S. PATENT DOCUMENTS

| | | | |
|---|---|---|---|
| 5,182,226 A | * 1/1993 | Jang | 438/440 |
| 5,712,186 A | * 1/1998 | Thakur et al. | 438/440 |
| 5,733,813 A | 3/1998 | Chen et al. | 438/440 |
| 5,895,252 A | * 4/1999 | Lur et al. | 438/423 |
| 5,960,301 A | * 9/1999 | Lee | 438/445 |
| 5,976,952 A | 11/1999 | Grdner et al. | 438/440 |
| 5,998,277 A | * 12/1999 | Wu | 438/407 |
| 6,001,709 A | * 12/1999 | Chaung et al. | 438/440 |
| 6,027,984 A | 2/2000 | Thakur et al. | 438/440 |
| 6,066,530 A | * 5/2000 | Templeton et al. | 438/257 |
| 6,333,243 B1 | * 12/2001 | Thakur et al. | 438/440 |

FOREIGN PATENT DOCUMENTS

DE 19919406 A 2/1999 .......... H01L/21/762

OTHER PUBLICATIONS

Patent Abstracts of Japan, Arakawa Tomiyuki, "Method Of Forming Silicon Oxide Film Field Oxide Film," Publication No. 10144678, May 29, 1998, Application No. 08292889, May 11, 1996.

Patent Abstracts of Japan, Takano Masamichi "Semiconductor Device And Manufacturing Method Thereof," Publication No. 10135323, May 22, 1998, Application No. 08289691, Oct. 31, 1996.

* cited by examiner

Primary Examiner—Carl Whitehead, Jr.
Assistant Examiner—David S Blum
(74) Attorney, Agent, or Firm—Aaron Waxler

(57) ABSTRACT

The formation of the isolating region includes ion implantation in the voluminal part, followed by annealing of said implanted voluminal part (7) of the substrate (1).

12 Claims, 6 Drawing Sheets

PROCESS FOR FORMING SHALLOW ISOLATING REGIONS IN AN INTEGRATED CIRCUIT AND AN INTEGRATED CIRCUIT THUS FORMED

BACKGROUND OF THE INVENTION

1. Field of the Invention

The present invention relates to the manufacture of integrated circuits and notably to the formation of shallow voluminal isolating regions or isolating lateral regions.

2. Description of Related Art

Such shallow voluminal isolating regions serve to realize electrical isolation in the lateral direction between the active regions that contain the active elements, being mainly CMOS transistors, of an integrated circuit realized on a semiconductor substrate.

Nowadays such isolating regions are formed in principle by chemical etching of the desired parts of the surface of the semiconductor substrate so as to form grooves of a desired depth. Subsequently, after a given number of steps for preparation and cleaning, an electrically isolating oxide is deposited on the entire surface of the structure so that the groove is completely filled. The excess oxide material is subsequently removed again by means of a chemical etching process.

An example of the formation of such isolating regions in conformity with prior art will be described in detail hereinafter.

First stack of layers is formed on the surface of the substrate of semiconductor material (wafer). First of all (i) a sacrificial oxide layer or buffer layer, commonly referred to as a "padox" by those skilled in the art, is formed on the upper surface of the substrate. (ii) A second layer, referred to hereinafter as a "hard mask" (for example, $Si_3N_4$) in view of its ultimate function, is subsequently formed by chemical deposition in the vapor phase (CVD). (iii) A resin mask which defines the dimensions of the future isolating region is subsequently formed on the hard mask layer. (iv) The hard mask layer (silicon nitride) and the buffer layer (silicon oxide) are removed through the opening of the resin mask so as to expose the upper surface of the substrate. (v) The substrate is then subjected to chemical etching in depth in order to form the groove. When the desired groove depth is reached, (vi) the resin layer is removed.

(vii) In the course of a later treatment that is known to those skilled in the art as "exposure of the padox", the buffer layer (silicon oxide), still being sandwiched between the substrate and the hard mask layer (silicon nitride) at this stage of the process, is subjected to lateral etching so as to obtain a cavity at a desired lateral distance. (viii) Before the groove is filled, it is oxidized.

(ix) The groove is subsequently filled with silicon dioxide and then (x) with TEOS (tetraorthosilicate of ethyl) oxide or with an oxide of the type HDP (high density plasma) before (xi) starting with densification annealing in a furnace or an apparatus of the type RTP (rapid thermal process).

(xii) A block of resin is thus formed on the oxide TEOS above the groove.

(xiii) Using the resin block as a mask, chemical etching is performed on the structure, after which (xiv) the resin block is removed and (xv) chemical-mechanical polishing (CMP) is performed until the hard mask layer (silicon nitride) becomes exposed.

(xvi) Finally, the hard mask layer outside the grooves is eliminated by chemical etching.

Such a prior art process is not very practical in that it is necessary to carry out a large number of steps, notably chemical etching operations in a humid environment, and some of these steps are difficult to master. Moreover, it has been found that it is difficult to achieve a reproducible uniformity for the groove structure in the various areas on the substrate and in the various substrates in different batches.

BRIEF SUMMARY OF THE INVENTION

It is the object of the invention to provide a solution to these problems.

One of the objects of the present invention is to reduce the number of steps, and hence the manufacturing costs, that has to be carried out for the formation of a shallow isolating region. Another object is to realize a process that can be mastered better and yields a better reproducible uniformity for the structure of the isolating region.

Therefore, the invention proposes a process for manufacturing an integrated circuit which includes a step for forming an isolating region within a voluminal part of a substrate. In conformity with a general characteristic aspect of the invention, the formation of the isolating region includes an ion implantation in said voluminal part, followed by annealing of said implanted voluminal part of the substrate.

These two steps in accordance with the invention replace the steps (iv) and (xiv) of the prior art process described above.

It is to be noted that the annealing leads to the formation of oxide in the implanted zone. Moreover, because use is made of a monocrystalline substrate, the implanted zone will be enclosed by a monocrystalline silicon network which facilitates the formation and the recrystallization of the oxide.

Moreover, the two steps in accordance with the invention not only give rise to recrystallization of the oxide, but also to regeneration of the silicon network at the interface between the silicon (active zone) and the oxide (isolating region).

In one version the ions implanted in the voluminal part of the substrate are oxygen ions. The annealing operation in particular can be performed at a high temperature.

In conformity with one version of the invention, the formation of the isolating region includes the steps of:

forming a stack of layers, including a buffer layer and a masking layer, on a substrate, providing the masking layer with an opening whose dimensions define those of said isolating region.

This opening thus exposes a part of the buffer layer. The implantation of ions in the substrate is carried out through the buffer layer.

Various versions of the invention can be used for advantageously completing the formation of an isolating region by implantation and annealing.

Thus, in conformity with one version the following steps may be carried out after the implantation:

1a) covering the masking layer, the lateral walls of the opening and the exposed part of the buffer layer within the opening with an oxide cover layer;

1b) chemical mechanical polishing of the upper surface of the structure obtained in the step 1a), and 1c) selectively removing the masking layer. This leaves a residue of the initial oxide layer applied during the step 1a).

According to this version, the oxide cover layer makes it possible to realize an additional oxide thickness which enables the consumption of oxide in the isolating region to be minimized during the selective etching; it also minimizes the risk of formation of a depression (step) in the isolating region relative to the active zone which would have an adverse effect on the operation of MOS devices.

In another version the covering by means of the oxide cover layer can be performed prior to implantation. In that case the implantation takes place through the oxide cover layer and through the buffer layer. The oxide cover layer then serves to minimize the overall consumption of oxide during the implantation which is due to the oxide erosion phenomenon (sputtering) that inevitably occurs during any implantation. This oxide layer will subsequently also serve as indicated for protection during the selective etching.

In another version the following steps may be carried out:

2a) covering, by selective oxidation, the lateral wall of the opening and the exposed part of the buffer layer within the opening by means of an oxide cover layer, and 2b) selectively etching the masking layer. This again leaves a residue of the initial oxide layer on the previously exposed part of the buffer layer.

Moreover, according to this version, and analogously to that explained above, the oxide cover layer obtained by selective oxidation also enables an additional oxide thickness to be obtained, thus enabling a minimization of the oxide consumption of the isolating region as well as of the risk of forming a depression (step) of the isolating region relative to the active zone.

In another version the covering by the oxide cover layer realized by selective oxidation may also be performed prior to implantation. In that case, analogously as explained above, the implantation takes place through said oxide cover layer and through the buffer layer. The oxide cover layer then also serves to minimize the overall oxide consumption during the implantation that is due to the oxide erosion phenomenon (sputtering) that inevitably occurs during any implantation. This oxide layer will subsequently also act as indicated above for the protection during the selective etching.

In another version yet, the ion implantation in accordance with the invention is carried out in such a manner that the implanted voluminal part is situated at a distance from the upper surface of the substrate. Thus the following steps are advantageously performed:

3a) eliminating the buffer layer within the opening, thus enabling cleaning of the surface, 3b) locally oxidizing the part of the substrate that is situated above said implanted voluminal part, that is, within the opening, and 3c) selectively etching the masking layer. This leads to the formation of a vault of oxidized substrate above the oxidized voluminal part.

In comparison with the prior art process described above, the process in accordance with the invention offers a number of advantages. Notably the chemical etching of the groove and the oxidation of the lateral walls and the bottom of the groove, being the object of said chemical etching, are avoided. The oxidation step is comparatively long and the transverse sectional profile of the resultant groove (depth and shape) is difficult to master exactly.

However, during the ion implantation step in accordance with the invention the profile (shape and depth) of the isolating volume can be adequately mastered by fine adjustment of the parameters of this step, notably the kinetic energy of the ions in the ion beam, the intensity of the ion beam, and the duration of exposure of the substrate to the ion beam.

The flatness of the upper surface of the isolating voluminal part that results from the recrystallization and selective etching steps performed on the masking layer is improved in comparison with the prior art process.

The number of photolithographic steps is reduced.

The reduction of the number of steps in the process in accordance with the invention results in much easier control of the process and hence in better reproducibility.

Other characteristics and advantages of the invention will become apparent from the following, non-limitative, detailed description of embodiments and the accompanying drawings; therein:

DETAILED DESCRIPTION OF THE INVENTION

Figure 1A:
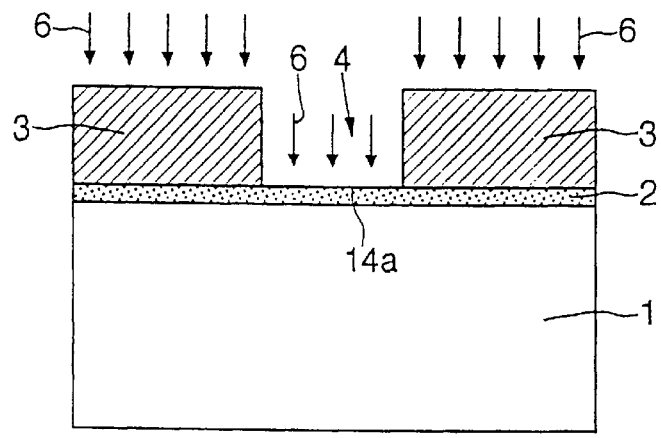
FIGS. 1a to 1d show diagrammatically the principal steps of a first version of the process in accordance with the invention.

FIG. 1a is a diagrammatic transverse sectional view ofa substrate 1 used for the formation of an integrated circuit. The upper surface of the substrate has been covered with a buffer layer 2 and a masking layer 3 has been deposited on the buffer layer 2.

The material of the substrate 1 generally is monocrystalline silicon. The thickness of the substrate is, for example, of the order of magnitude of 3 microns. The buffer layer 2, currently referred to as "padox" by those skilled in the art, typically consists of silicon dioxide and has been formed by growing. The thickness of the buffer layer 2 is, for example of the order of magnitude of from 50 to 200 Å.

The masking layer 3 is obtained typically by chemical deposition in the vapor phase (CVD) and is made of, for example silicon nitride ($Si_3N_4$). The location of the future isolating groove is defined by means of a conventional photolithographic process, after which the layer 3 is etched in said location so as to form an opening 4 which exposes the surface 14a of the layer 2.

The substrate is then ready to be exposed to an ion beam 6. In the opening 4 the ion beam strikes the exposed surface of the buffer layer 2 and penetrates the buffer layer as far as the substrate 1. Outside the opening 4 the ion beam 6 is absorbed by the resin layer 3.

The depth of penetration of the ions into the substrate 1 can be controlled by way of the mean kinetic energy of the ions in the ion beam 6. The concentration of the ions thus implanted is controlled by the duration of the exposure of the structure illustrated in FIG. 1 and by the intensity (more specifically the current density) of the ion beam 6. Preferably, the concentration of the implanted ions is chosen as a function of the material of the substrate so that a stoichiometric equilibrium is achieved with the material of the substrate, resulting in the formation of an electrically insulating electrical material after annealing as will be explained hereinafter.

Subsequently, in order to achieve an attractive, substantially homogeneous distribution of the ions at different depths, a series of implantations can be performed with different respective energies/doses. A final oxidation will thus be obtained which is as uniform as possible on the surface as well as in depth.

Preferably, the ions implanted are oxygen ions. However, in accordance with the invention other types of ions that, after annealing and in association with the material of the substrate, lead to the formation of an electrically insulating material could be used just as well.

Figure 1B:
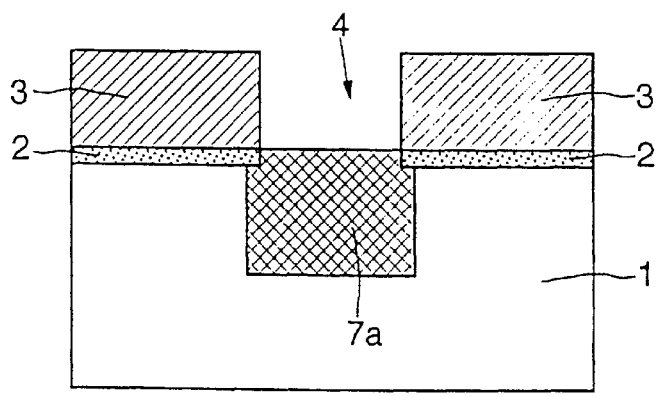

FIG. 1b diagrammatically illustrates the situation after the exposure of the structure shown in FIG. 1a to the ion beam. Inside the substrate 1 an implanted voluminal part 7a has been created. The depth of this implanted voluminal part 7a has been determined by the kinetic energy of the ions in the course of one or more implantations. The interaction of the ions with the buffer layer 2 and the substrate 1 leads to multiple diffusion phenomena. Consequently, the width of the implanted region 7a is slightly larger than the width of the opening 4.

Figure 1C:
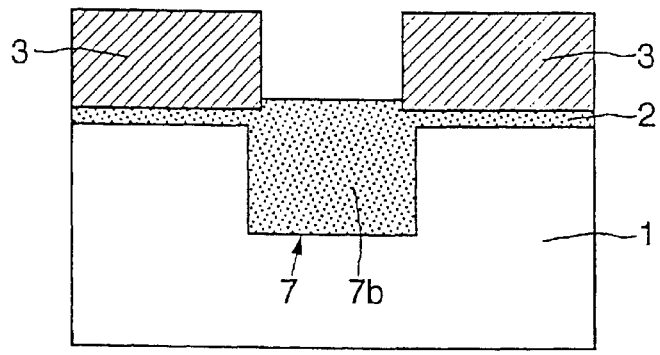

Subsequent to the ion implantation, the structure obtained in FIG. 1b is treated so as to obtain an electrically insulating material in the implanted voluminal part 7a. One solution consists in annealing the structure at high temperatures for a period of time which suffices to achieve complete transformation of the material. Thus, for example, annealing could be performed at a temperature higher than 1100° C., for example a temperature of between 1200° C. and 1350° C., for a period of time of at least 3 hours, that is, generally a period of time of the order of magnitude of from 5 to 6 hours for annealing at 1300° C. Preferably, the electrically insulating material 7b (FIG. 1c) is silicon dioxide. After the annealing step, the buffer layer and the annealed voluminal part 7b are then homogeneous because they both consist of silicon oxide as shown in FIG. 1c.

Figure 1D:
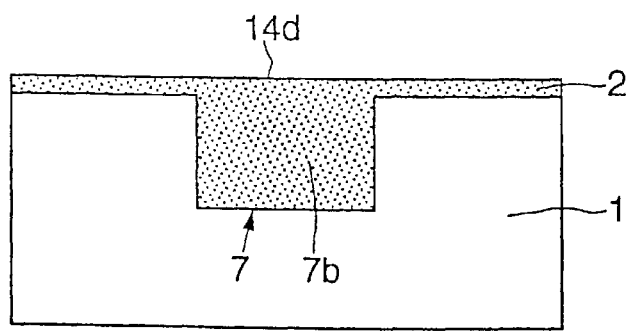

Once the formation of oxide has been accomplished, the hard mask 3 is eliminated so as to obtain the structure illustrated in FIG. 1d. This can be realized by way of selective chemical etching process that is known per se to those skilled in the art. Thus, when the hard mask is formed in particular by silicon nitride, an aqueous solution of $H_3PO_4$ can be advantageously used.

At this stage of the process in accordance with the invention, the voluminal part 7b, consisting of oxide, forms the desired shallow isolating region 7. Even though the upper surface of the layer 2 and the region 7b have been slightly etched during the removal of the layer 3, the surface 14d of the structure is essentially flat after the elimination of the hard mask.

Five versions of the process in accordance with the invention will now be described with reference to the FIGS. 2 to 6.

Figure 2A:
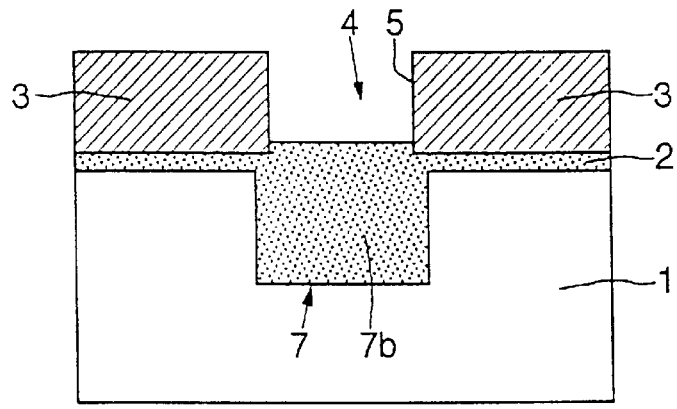
FIGS. 2a to 2d show diagrammatically the principal steps of a second version of the process in accordance with the invention.

The structure shown in FIG. 2a corresponds to that shown in FIG. 1c.

Figure 2B:
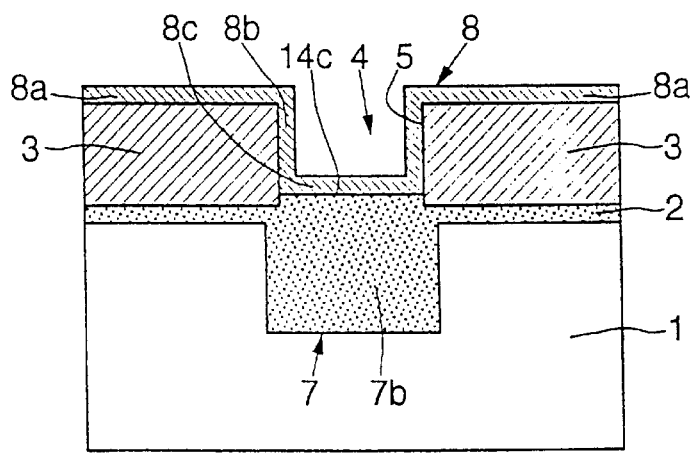

An oxide cover layer 8 is homogeneously deposited on the entire structure shown in FIG. 2a, thus producing the structure shown in FIG. 2b. The oxide layer 8 has a uniform thickness, that is, in all its parts 8a to 8c. The oxide layer 8 may be formed, for example, by TEOS oxide which can be deposited by chemical deposition in the vapor phase. Its thickness is of the order of magnitude of from 50 to 500 Å.

Figure 2C:
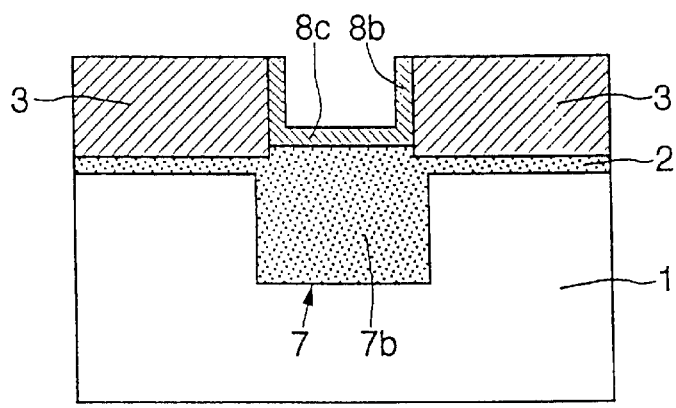
Figure 2D:
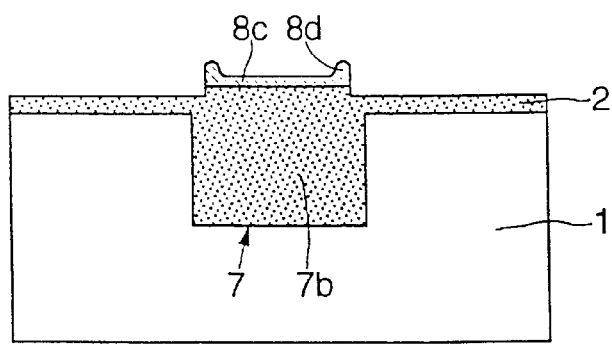

During the next step, whose result is shown in FIG. 2c, a chemical-mechanical polishing operation is performed so as to eliminate the part 8a of the oxide layer covering the hard masking layer 3.

Finally, the hard masking layer is selectively removed in a manner analogous to that described with reference to FIG. 1d. The desired oxide cover layer is thus obtained, that is, an oxide layer which is formed by the part 8c of the initial oxide layer and by residues 8d of the parts 8b of the initial oxide layer that cover the lateral walls 5 of the opening 4 of FIG. 2b.

Figure 3A:
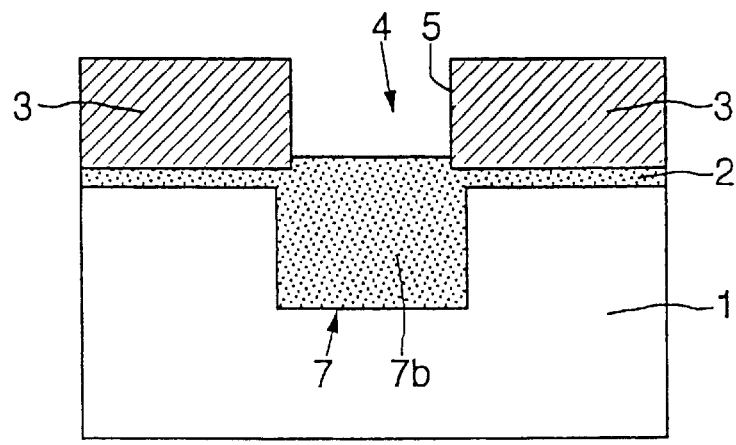
FIGS. 3a to 3c show diagrammatically the principal steps of a third version of the process in accordance with the invention.
Figure 3B:
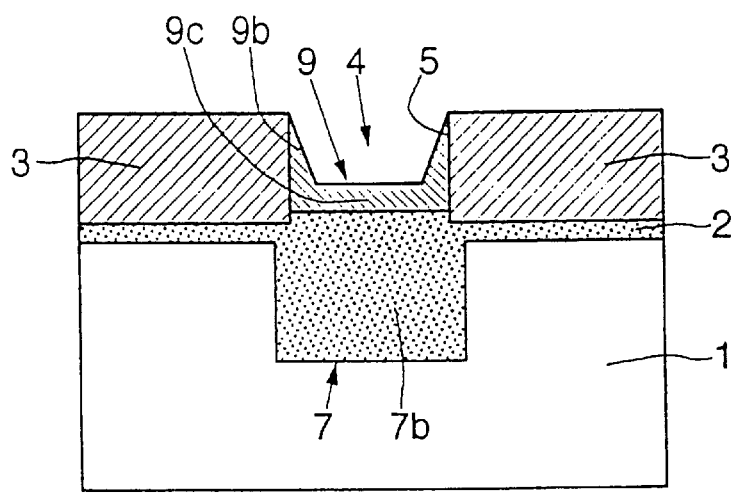
Figure 3C:
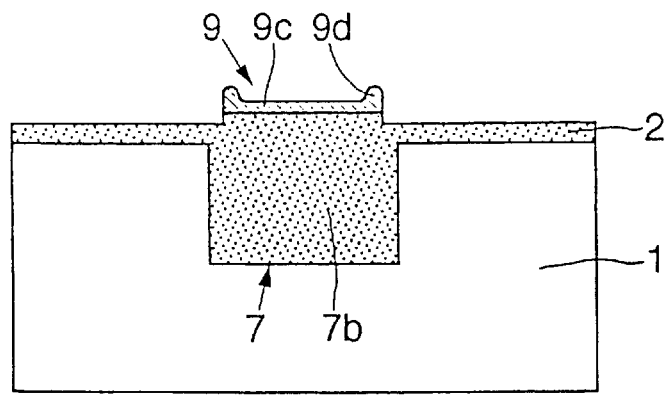

In the version illustrated in the FIGS. 3a to 3c the oxide cover layer is realized by way of a selective oxidation process. More specifically, selective oxidation of the structure shown in FIG. 3a is performed (this structure is analogous to that illustrated in FIG. 1c) so as to form an initial cover layer 9 (FIG. 3b) in the opening 4 of the resin mask. Subsequently, after selective removal of the mask 3 in a manner analogous to that previously described, there is obtained the structure which is illustrated in FIG. 3c and in which the implanted zone 7b is covered by a part of the part 9c of the initial layer 9 and residues 9d of the parts 9b.

Figure 4:
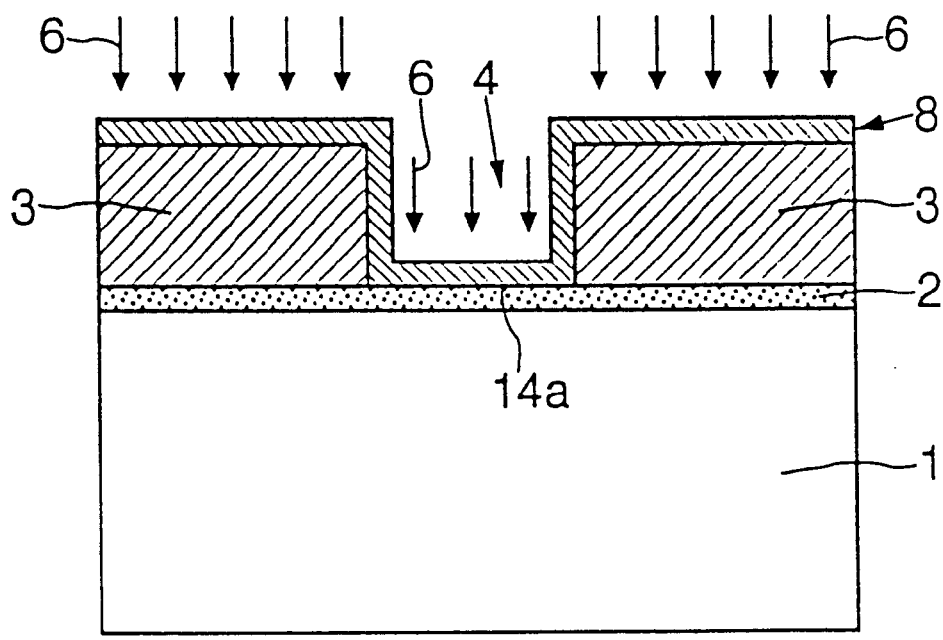
FIG. 4 illustrates, partly and diagrammatically, a fourth version of the process in accordance with the invention.
Figure 5:
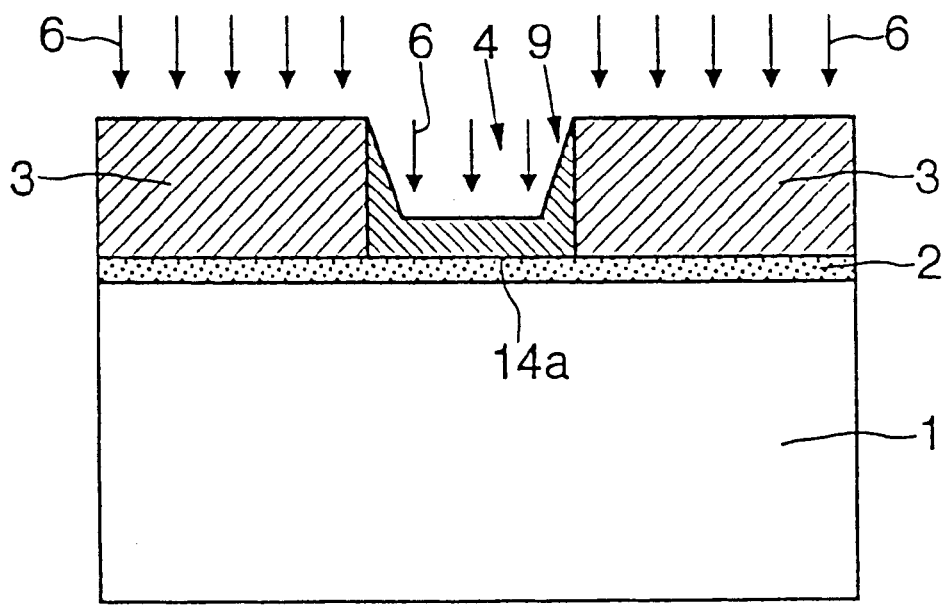
FIG. 5 illustrates, partly and diagrammatically, a fifth version of the process in accordance with the invention.

As is shown in the FIGS. 4 and 5, it is also possible to realize the oxide cover layers 8 (FIG. 4) or 9 (FIG. 5) before carrying out the ion implantation or implantations. In that case the ion implantation or implantations are carried out through the oxide cover layer 8 or 9 and through the buffer layer. After annealing there is obtained a configuration which is analogous to that illustrated in FIG. 2b or 3b and the process continues as described above.

Figure 6A:
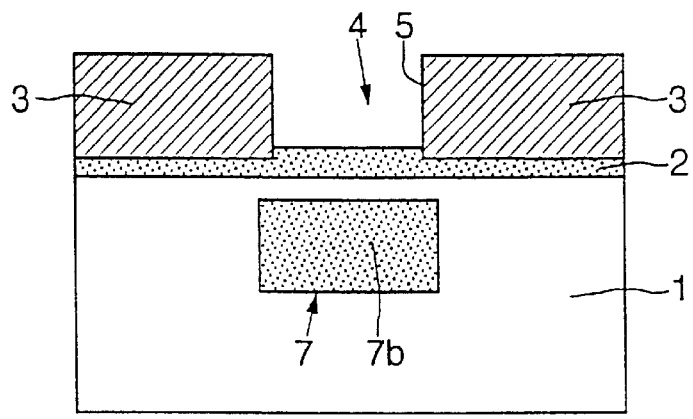
FIGS. 6a to 6d illustrate diagrammatically the principal steps of a sixth version of the process in accordance with the invention.
Figure 6B:
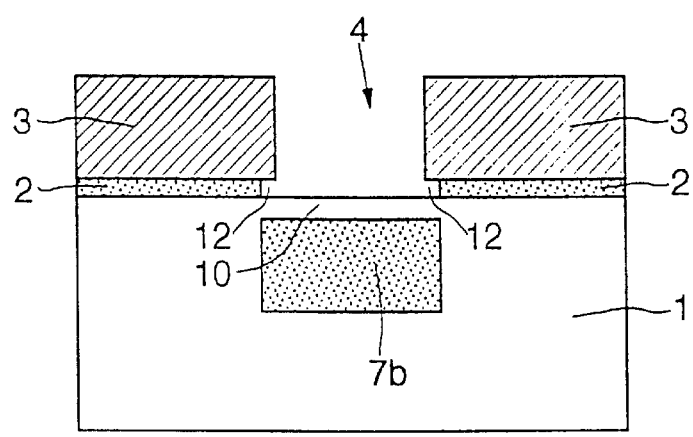

In the version shown in the FIGS. 6a to 6d, one or several ion implantations are performed at different depths (FIG. 6a). Thus, an implanted portion 7b is formed which is situated at a distance from the upper surface of the substrate 1. Subsequently, as indicated above, the portion 7b is subjected to annealing. Subsequently, as is shown in FIG. 6b, a selective chemical etching operation is performed on the buffer layer 2; this also causes slight lateral etching of the layer 2 which gives rise to cavities 12 underneath the resin layer 3.

Figure 6C:
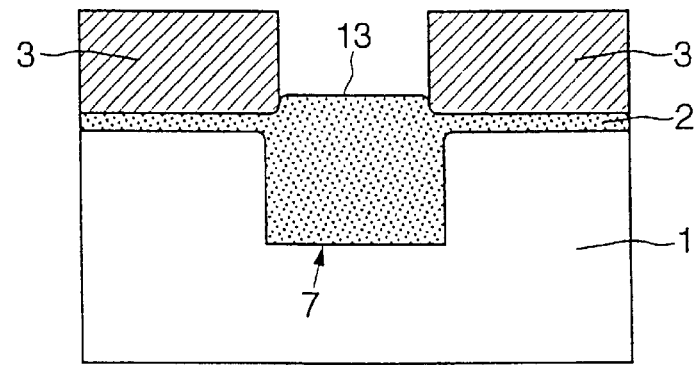

Subsequently, as is illustrated in FIG. 6c, a local oxidation of the substrate is performed in the opening 4. Such a local oxidation is known to those skilled in the art, that is, as "minilocos". The part 10 of the substrate (situated above the implanted region 7b), consequently, is oxidized and leads to the formation of a vault 13 as illustrated in the FIGS. 6c and 6d.

Figure 6D:
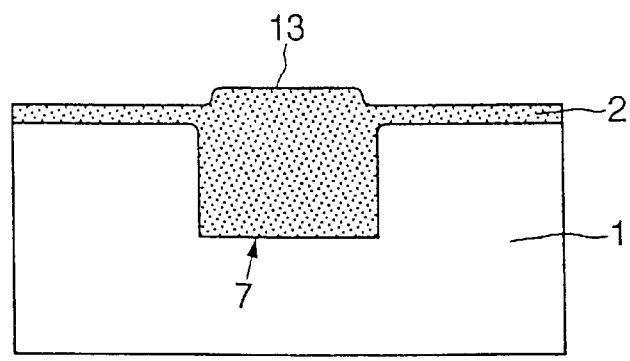

Finally, as is illustrated in FIG. 6d, the masking layer 3 is eliminated in a manner similar to that described above in order to realize the isolating region which projects above the substrate 1.

Figure 7:
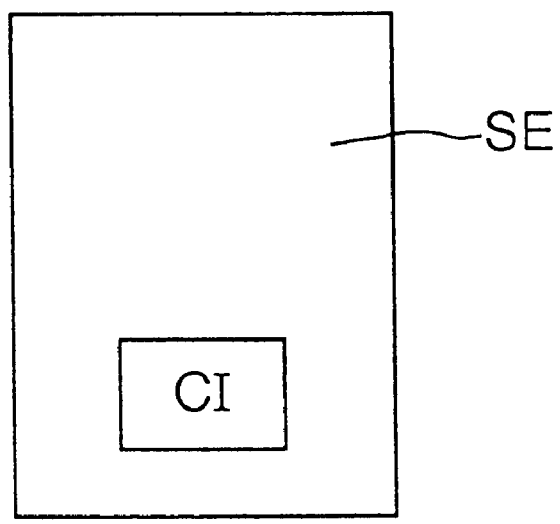
FIG. 7 illustrates very diagrammatically an electronic system which includes at least one integrated circuit realized by means of the process in accordance with the invention.

An integrated circuit obtained by means of the process in accordance with the invention can be used in many applications in the field of electronic systems. FIG. 7 very diagrammatically illustrates such an electronic system SE which includes at least one integrated circuit CI in accordance with the invention.

Figure 8:
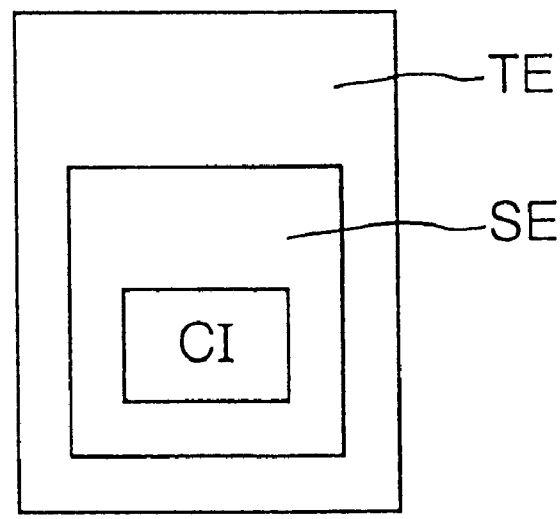
FIG. 8 illustrates very diagrammatically a terminal for mobile telephony, such as a cellular mobile telephone or a base station which includes at least one electronic system as illustrated in FIG. 7.

Moreover, the process for the manufacture of integrated circuits in accordance with the invention is particularly well suitable for the realization of electronic systems that are used in telecommunication apparatus. Thus, FIG. 8 very diagrammatically illustrates a terminal for mobile telephony TE, such as a cellular mobile telephone or a base station, which includes at least one electronic system SE which incorporates at least one integrated circuit CI in accordance with the invention.

What is claimed is:

1. A process for manufacturing an integrated circuit which includes a step for forming an isolating region within a voluminal part of a substrate wherein the voluminal part is bounded by a surface of the substrate, characterized in that the formation of the isolating region includes an ion implantation in substantially all of said voluminal part, wherein said ion implantation exposes the voluminal part along the surface of the substrate, followed by annealing of said implanted voluminal part of the substrate.

2. A process as claimed in claim 1, characterized in that the ions implanted in the voluminal part of the substrate are oxygen ions.

3. A process as claimed in claim 1, characterized in that the annealing operation is performed at a high temperature.

4. A process as claimed in claim 1, characterized in that the formation of the isolating region also includes the steps of:
   a) forming a stack of layers, including a buffer layer (2) and a masking layer (3), on the substrate (1),
   b) providing the masking layer (3) with an opening (4) whose dimensions define those of said isolating region, said opening exposing a part of the buffer layer, and in that the ion implantation is carried out through the buffer layer.

5. A process as claimed in claim 4, characterized in that the formation of the isolating region includes inter alia the step of:
   a) covering the masking layer (3), the lateral walls (5) of the opening (4) and the exposed part of the buffer layer within the opening (4) with an oxide cover layer (8), and in that the implantation is performed through the oxide cover layer and through the buffer layer.

6. A process as claimed in claim 4, characterized in that the formation of the isolating region also includes, after the implantation, the step of:
   a) covering the masking layer (3), the lateral walls (5) of the opening (4) and the exposed part of the buffer layer within the opening (4) with an oxide cover layer (8).

7. A process for manufacturing an integrated circuit, including forming an isolating region within a voluminal part of a substrate, characterized in that the formation of the isolating region includes:
   forming a stack of layers, including a buffer layer and a masking layer, on the substrate;
   providing the masking layer with an opening whose dimensions define those of said isolating region, said opening exposing a part of the buffer layer;
   covering the masking layer, the lateral walls of the opening and the exposed part of the buffer layer within the opening with an oxide cover layer;
   implanting ions in said voluminal part, wherein the ion implantation is carried out through the buffer layer and the oxide cover layer;
   annealing of said implanted voluminal part of the substrate;
   chemical mechanical polishing of the upper surfaces of the structure obtained in the covering step; and
   selectively removing the masking layer in order to leave a residue of the oxide cover layer.

8. A process as claimed in claim 4, characterized in that the formation of the isolating region includes the step of:
   a) covering, by selective oxidation, the lateral wall (5) of the opening and the exposed part of the buffer layer within the opening (4) by means of an oxide cover layer (9), and in that the implantation is performed through the oxide cover layer and through the buffer layer.

9. A process as claimed in claim 4, characterized in that the formation of the isolating region also includes, after implantation, the step of:
   a) covering, by selective oxidation, the lateral wall (5) of the opening and the exposed part of the buffer layer within the opening (4) by means of an oxide cover layer (9).

10. A process for manufacturing an integrated circuit, including forming an isolating region within a voluminal part of a substrate, characterized in that the formation of the isolating region includes:
    forming a stack of layers, including a buffer layer and a masking layer, on the substrate;
    providing the masking layer with an opening whose dimensions define those of said isolating region, said opening exposing a part of the buffer layer;
    covering, by selective oxidation, the lateral wall of the opening and the exposed part of the buffer layer within the opening by means of an oxide cover layer;
    implanting ions in said voluminal part, wherein the ion implantation is carried out through the buffer layer and the oxide cover layer;
    annealing of said implanted voluminal part of the substrate; and
    selectively etching the masking layer in order to leave a residue of the oxide cover layer.

11. A process as claimed in claim 4, characterized in that the ion implantation is performed in such a manner that the implanted voluminal part (7b) is situated at a distance from the upper surface of the substrate, and in that the following steps are also carried out:
    a) eliminating the buffer layer within the opening (4),
    b) locally oxidizing the part (10) of the substrate that is situated above said implanted voluminal part (7b), that is, within the opening (4), and
    c) selectively etching the masking layer.

12. A process as claimed in claim 3, characterized in that the high temperature is between approximately 1200 to 1350 degrees Celsius.

* * * * *